United States Patent
Grover et al.

(10) Patent No.: US 11,201,257 B2
(45) Date of Patent: Dec. 14, 2021

(54) METHODS FOR GROUP V DOPING OF PHOTOVOLTAIC DEVICES

(71) Applicant: First Solar, Inc., Tempe, AZ (US)

(72) Inventors: Sachit Grover, Campbell, CA (US);
Dingyuan Lu, San Jose, CA (US);
Roger Malik, Santa Clara, CA (US);
Gang Xiong, Santa Clara, CA (US)

(73) Assignee: First Solar, Inc., Tempe, AZ (US)

( * ) Notice: Subject to any disclaimer, the term of this patent is extended or adjusted under 35 U.S.C. 154(b) by 0 days.

(21) Appl. No.: 16/966,424

(22) PCT Filed: Jan. 14, 2019

(86) PCT No.: PCT/US2019/013437
§ 371 (c)(1),
(2) Date: Jul. 30, 2020

(87) PCT Pub. No.: WO2019/152174
PCT Pub. Date: Aug. 8, 2019

(65) Prior Publication Data
US 2021/0036178 A1    Feb. 4, 2021

Related U.S. Application Data

(60) Provisional application No. 62/624,846, filed on Feb. 1, 2018.

(51) Int. Cl.
*H01L 31/18* (2006.01)
*H01L 31/0296* (2006.01)
*H01L 31/073* (2012.01)

(52) U.S. Cl.
CPC ...... *H01L 31/1828* (2013.01); *H01L 31/1832* (2013.01); *H01L 31/1872* (2013.01);
(Continued)

(58) Field of Classification Search
None
See application file for complete search history.

(56) References Cited

U.S. PATENT DOCUMENTS 8,748,214 B2   6/2014  DeLuca et al.
9,318,642 B2   4/2016  Gupta et al.
(Continued)

FOREIGN PATENT DOCUMENTS

WO    2007129097 A2    11/2007

OTHER PUBLICATIONS

Niles et al., "Chemical reactivity of $CdCl_2$ wet-deposited on CdTe films studied by X-ray photoelectron spectroscopy", Applied Surface Science, 1998, vol. 136, pp. 221-229.
(Continued)

*Primary Examiner* — Benjamin P Sandvik
(74) *Attorney, Agent, or Firm* — MacMillan, Sobanski & Todd, LLC (57) ABSTRACT

According to the embodiments provided herein, a method for doping an absorber layer can include contacting the absorber layer with an annealing compound. The annealing compound can include cadmium chloride and a group V salt comprising an anion and a cation. The anion, the cation, or both can include a group V element. The method can include annealing the absorber layer, whereby the absorber layer is doped with at least a portion of the group V element of the annealing compound.

27 Claims, 5 Drawing Sheets

(52) U.S. Cl.
CPC .. *H01L 31/02963* (2013.01); *H01L 31/02966* (2013.01); *H01L 31/073* (2013.01)

(56) References Cited

U.S. PATENT DOCUMENTS

| | | | |
|---|---|---|---|
| 9,537,039 B2 | 1/2017 | Gupta et al. | |
| 10,861,994 B2 | 12/2020 | Abken et al. | |
| 2011/0315221 A1* | 12/2011 | Hunt | H01L 31/0368 136/258 |
| 2013/0074914 A1* | 3/2013 | Foust | H01L 31/02963 136/256 |
| 2013/0180579 A1 | 7/2013 | Jin et al. | |
| 2016/0126395 A1 | 5/2016 | Damjanovic et al. | |
| 2017/0352775 A1 | 12/2017 | Hahn et al. | |
| 2020/0035844 A1 | 1/2020 | Grover et al. | |
| 2020/0381567 A1 | 12/2020 | Cao et al. | |
| 2021/0091250 A1 | 3/2021 | Abken et al. | |
| 2021/0143288 A1 | 5/2021 | Grover et al. | |

OTHER PUBLICATIONS

European Communication pursuant to Article 94(3) EPC, dated Apr. 29, 2021, Application No. 19703820.1.
PCT International Search Report and Written Opinion for PCT international application No. PCT/US2019/013437, dated Apr. 23, 2019, pp. 1-13.

* cited by examiner

METHODS FOR GROUP V DOPING OF PHOTOVOLTAIC DEVICES

CROSS-REFERENCE TO RELATED APPLICATIONS

This is a national phase application of international application PCT/US2019/013437, filed Jan. 14, 2019, and claims the benefit of U.S. Application 62/624,846, filed under 35 U.S.C. § 111(b) on Feb. 1, 2018; each of which is incorporated by reference in the entirety.

BACKGROUND

The present specification generally relates to methods for doping photovoltaic devices with group V dopants and, more specifically, methods for doping photovoltaic devices with group V dopants using an annealing compound.

A photovoltaic device generates electrical power by converting light into electricity using semiconductor materials that exhibit the photovoltaic effect. The semiconductor material can be doped with dopants, which can be activated to increase the charge carrier concentration of the semiconductor layer. The addition of dopants to a layer of semiconductor material can produce a material layer with predominantly negative, n-type, or positive, p-type, charge carriers. However, group V dopants can be difficult to incorporate into semiconductor layers using existing methods. For example, known doping methods can result in an insufficient volume of group V dopant within the semiconductor layer.

Accordingly, a need exists for alternative methods for doping photovoltaic devices with group V dopants.

SUMMARY

The embodiments provided herein relate to methods for doping photovoltaic devices with group V dopants. These and additional features provided by the embodiments described herein will be more fully understood in view of the following detailed description, in conjunction with the drawings.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, where like structure is indicated with like reference numerals and in which:

DETAILED DESCRIPTION

Embodiments of a photovoltaic device for generating electrical power from light are described herein. The photovoltaic device generally includes an absorber layer formed from a semiconductor material. The absorber layer can be subjected to one or more processing steps configured to dope the absorber layer with a group V dopant such as, for example, arsenic or phosphorous. Various embodiments of methods for doping an absorber layer with group V dopants will be described in more detail herein.

Figure 1:
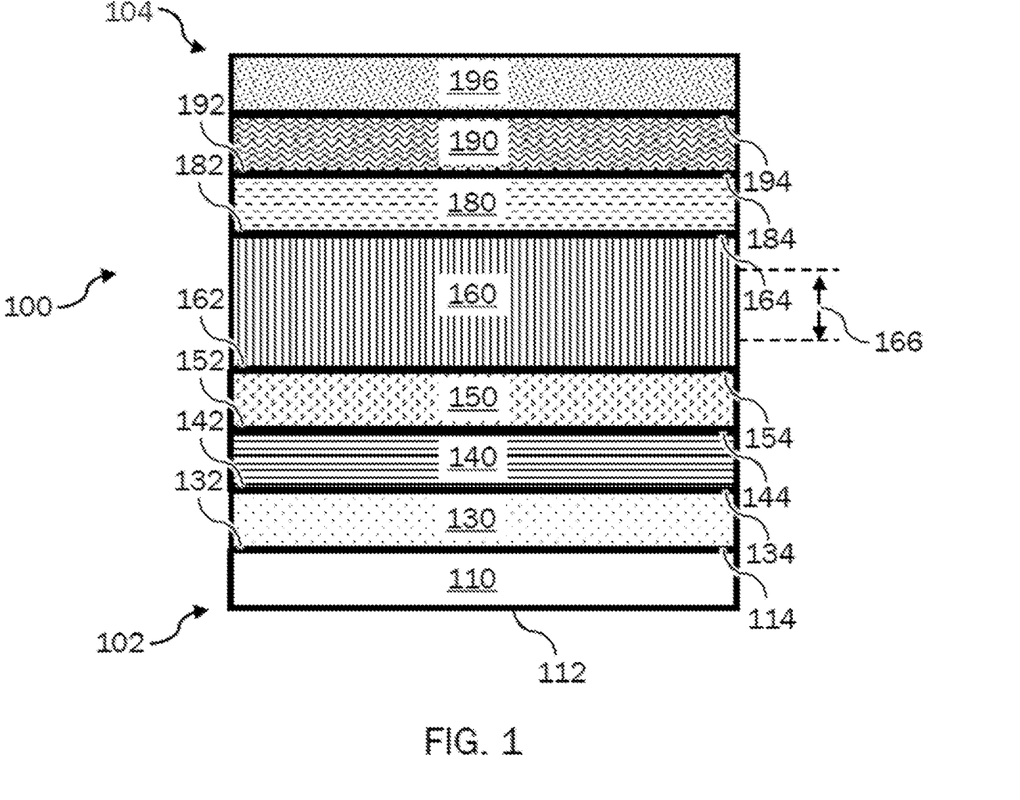
FIG. 1 schematically depicts a photovoltaic device according to one or more embodiments shown and described herein.

Referring now to FIG. 1, an embodiment of a photovoltaic device 100 is schematically depicted. The photovoltaic device 100 can be configured to receive light and transform light into electrical signals, e.g., photons can be absorbed from the light and transformed into electrical signals via the photovoltaic effect. Accordingly, the photovoltaic device 100 can define an energy side 102 configured to be exposed to a light source such as, for example, the sun. The photovoltaic device 102 can also define an opposing side 104 offset from the energy side 102. It is noted that the term "light" can refer to various wavelengths of the electromagnetic spectrum such as, but not limited to, wavelengths in the ultraviolet (UV), infrared (IR), and visible portions of the electromagnetic spectrum. The photovoltaic device 100 can include a plurality of layers disposed between the energy side 102 and the opposing side 104. As used herein, the term "layer" refers to a thickness of material provided upon a surface. Each layer can cover all or any portion of the surface.

Figure 2:
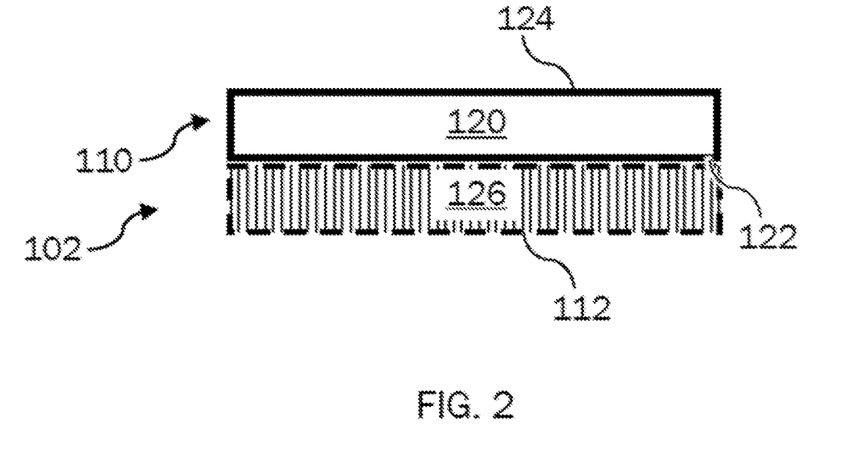
FIG. 2 schematically depicts a substrate according to one or more embodiments shown and described herein.

The photovoltaic device 100 can include a substrate 110 configured to facilitate the transmission of light into the photovoltaic device 100. The substrate 110 can be disposed at the energy side 102 of the photovoltaic device 100. Referring collectively to FIGS. 1 and 2, the substrate 110 can have a first surface 112 substantially facing the energy side 102 of the photovoltaic device 100 and a second surface 114 substantially facing the opposing side 104 of the photovoltaic device 100. One or more layers of material can be disposed between the first surface 112 and the second surface 114 of the substrate 110.

The substrate 110 can include a transparent layer 120 having a first surface 122 substantially facing the energy side 102 of the photovoltaic device 100 and a second surface 124 substantially facing the opposing side 104 of the photovoltaic device 100. In some embodiments, the second surface 124 of the transparent layer 120 can form the second surface 114 of the substrate 110. The transparent layer 120 can be formed from a substantially transparent material such as, for example, glass. Suitable glass can include soda-lime glass, or any glass with reduced iron content. The transparent layer 120 can have any suitable transmittance, including about 250 nm to about 950 nm in some embodiments. The transparent layer 120 may also have any suitable transmission percentage, including, for example, more than about 50% in one embodiment, more than about 60% in another embodiment, more than about 70% in yet another embodiment, more than about 80% in a further embodiment, or more than about 85% in still a further embodiment. In one embodiment, transparent layer 120 can be formed from a glass with about 90% transmittance. Optionally, the substrate 110 can include a coating 126 applied to the first surface 122 of the transparent layer 120. The coating 126 can be configured to interact with light or to improve durability of the substrate 110 such as, but not limited to, an antireflective coating, an antisoiling coating, or a combination thereof.

Referring again to FIG. 1, the photovoltaic device 100 can include a barrier layer 130 configured to mitigate diffusion of contaminants (e.g. sodium) from the substrate 110, which could result in degradation or delamination. The barrier layer 130 can have a first surface 132 substantially facing the energy side 102 of the photovoltaic device 100 and a second surface 134 substantially facing the opposing side 104 of the photovoltaic device 100. In some embodiments, the barrier layer 130 can be provided adjacent to the substrate 110. For example, the first surface 132 of the barrier layer 130 can be provided upon the second surface 114 of the substrate 100. The phrase "adjacent to," as used herein, means that two layers are disposed contiguously and without any intervening materials between at least a portion of the layers.

Generally, the barrier layer 130 can be substantially transparent, thermally stable, with a reduced number of pin holes and having high sodium-blocking capability, and good adhesive properties. Alternatively or additionally, the barrier layer 130 can be configured to apply color suppression to light. The barrier layer 130 can include one or more layers of suitable material, including, but not limited to, tin oxide, silicon dioxide, aluminum-doped silicon oxide, silicon oxide, silicon nitride, or aluminum oxide. The barrier layer 130 can have any suitable thickness bounded by the first surface 132 and the second surface 134, including, for example, more than about 500 Å in one embodiment, more than about 750 Å in another embodiment, or less than about 1200 Å in a further embodiment.

Referring still to FIG. 1, the photovoltaic device 100 can include a transparent conductive oxide (TCO) layer 140 configured to provide electrical contact to transport charge carriers generated by the photovoltaic device 100. The TCO layer 140 can have a first surface 142 substantially facing the energy side 102 of the photovoltaic device 100 and a second surface 144 substantially facing the opposing side 104 of the photovoltaic device 100. In some embodiments, the TCO layer 140 can be provided adjacent to the barrier layer 130. For example, the first surface 142 of the TCO layer 140 can be provided upon the second surface 134 of the barrier layer 130. Generally, the TCO layer 140 can be formed from one or more layers of n-type semiconductor material that is substantially transparent and has a wide band gap. Specifically, the wide band gap can have a larger energy value compared to the energy of the photons of the light, which can mitigate undesired absorption of light. The TCO layer 140 can include one or more layers of suitable material, including, but not limited to, tin dioxide, doped tin dioxide (e.g., F—$SnO_2$), indium tin oxide, or cadmium stannate.

The photovoltaic device 100 can include a buffer layer 150 configured to provide an insulating layer between the TCO layer 140 and any adjacent semiconductor layers. The buffer layer 150 can have a first surface 152 substantially facing the energy side 102 of the photovoltaic device 100 and a second surface 154 substantially facing the opposing side 104 of the photovoltaic device 100. In some embodiments, the buffer layer 150 can be provided adjacent to the TCO layer 140. For example, the first surface 152 of the buffer layer 150 can be provided upon the second surface 144 of the TCO layer 140. The buffer layer 140 may include material having higher resistivity than the TCO later 140, including, but not limited to, intrinsic tin dioxide, zinc magnesium oxide (e.g., $Zn_{1-x}Mg_xO$), silicon dioxide ($SnO_2$), aluminum oxide ($Al_2O_3$), aluminum nitride (AlN), zinc tin oxide, zinc oxide, tin silicon oxide, or any combination thereof. In some embodiments, the material of the buffer layer 140 can be configured to substantially match the band gap of an adjacent semiconductor layer (e.g., an absorber).

The buffer layer 150 may have any suitable thickness between the first surface 152 and the second surface 154, including, for example, more than about 100 Å in one embodiment, between about 100 Å and about 800 Å in another embodiment, or between about 150 Å and about 600 Å in a further embodiment.

Referring again to FIG. 1, the photovoltaic device 100 can include an absorber layer 160 configured to cooperate with another layer and form a p-n junction within the photovoltaic device 100. Accordingly, absorbed photons of the light can free electron-hole pairs and generate carrier flow, which can yield electrical power. The absorber layer 160 can have a first surface 162 substantially facing the energy side 102 of the photovoltaic device 100 and a second surface 164 substantially facing the opposing side 104 of the photovoltaic device 100. A thickness of the absorber layer 160 can be defined between the first surface 162 and the second surface 164. The thickness of the absorber layer 160 can be between about 0.5 µm to about 10 µm such as, for example, between about 1 µm to about 7 µm in one embodiment, or between about 2 µm to about 5 µm in another embodiment.

According to the embodiments described herein, the absorber layer 160 can be formed from a p-type semiconductor material having an excess of positive charge carriers, i.e., holes or acceptors. The absorber layer 160 can include any suitable p-type semiconductor material such as group II-VI semiconductors. Specific examples include, but are not limited to, semiconductor materials comprising from cadmium, tellurium, selenium, or any combination thereof. Suitable examples include, but are not limited to, cadmium telluride, ternaries of cadmium, selenium and tellurium (e.g., $CdSe_xTe_{1-x}$), or quaternaries comprising cadmium, selenium and tellurium. In embodiments where the absorber layer 160 comprises selenium and cadmium, the atomic percent of the selenium can be greater than about 0 atomic percent and less than about 20 atomic percent. In embodiments where the absorber layer 160 comprises tellurium and cadmium, the atomic percent of the tellurium can be greater than about 30 atomic percent and less than about 50 atomic percent. It is noted that the atomic percent described herein is representative of the entirety of the absorber layer 160, the atomic percentage of material at a particular location within the absorber layer 160 can vary with thickness compared to the overall composition of the absorber layer 160. It is noted that the concentration of tellurium, selenium, or both can vary through the thickness of the absorber layer 160. For example, when the absorber layer 160 comprises a ternary of cadmium, selenium, and tellurium ($CdSe_xTe_{1-x}$), x can vary in the absorber layer 160 with distance from the first surface 162 of the absorber layer 160. In some embodiments, the value of x can decrease in the absorber layer 160 with distance from the first surface 162 of the absorber layer 160.

According to the embodiments provided herein, the dopant within the absorber layer 160 can be activated to a desired charge carrier concentration. In some embodiments, the absorber layer 160 can be doped with a group V dopant such as, for example, nitrogen (N), phosphorous (P), arsenic (As), antimony (Sb), bismuth (Bi), ununpentium (Uup), or a combination thereof. The total dosage of the dopant within the absorber layer 160 can be controlled. In some embodiments, an atomic concentration of Group V dopant in a central region 166 of the absorber layer 160 can be greater than about $1\times10^{16}$ cm$^{-3}$ such as, for example, between about $1\times10^{17}$ cm$^{-3}$ and about $5\times10^{20}$ cm$^{-3}$ in one embodiment, between about $3\times10^{17}$ cm$^{-3}$ and about $1\times10^{19}$ cm$^{-3}$ in another embodiment, or between about $5\times10^{17}$ cm$^{-3}$ and about $5\times10^{18}$ cm$^{-3}$ in a further embodiment. The central region 166 is the middle 50% of the absorber layer 160, which is offset by 25% of the thickness of the absorber layer 160 from each of the first surface 162 and the second surface 164 of the absorber layer 160. Alternatively or additionally, the concentration profile of the group V dopant can vary through the thickness of the absorber layer 160. Specifically, the amount of the group V dopant can vary with distance from the second surface 164 of the absorber layer 160.

Referring still to FIG. 1, the p-n junction can be formed by providing the absorber layer 160 sufficiently close to a portion of the photovoltaic device 100 having an excess of negative charge carriers, i.e., electrons or donors. In some embodiments, the absorber layer 160 can be provided adjacent to n-type semiconductor material. Alternatively, one or more intervening layers can be provided between the absorber layer 160 and n-type semiconductor material. In some embodiments, the absorber layer 160 can be provided adjacent to the buffer layer 150. For example, the first surface 162 of the absorber layer 160 can be provided upon the second surface 154 of the buffer layer 150.

Figure 3:
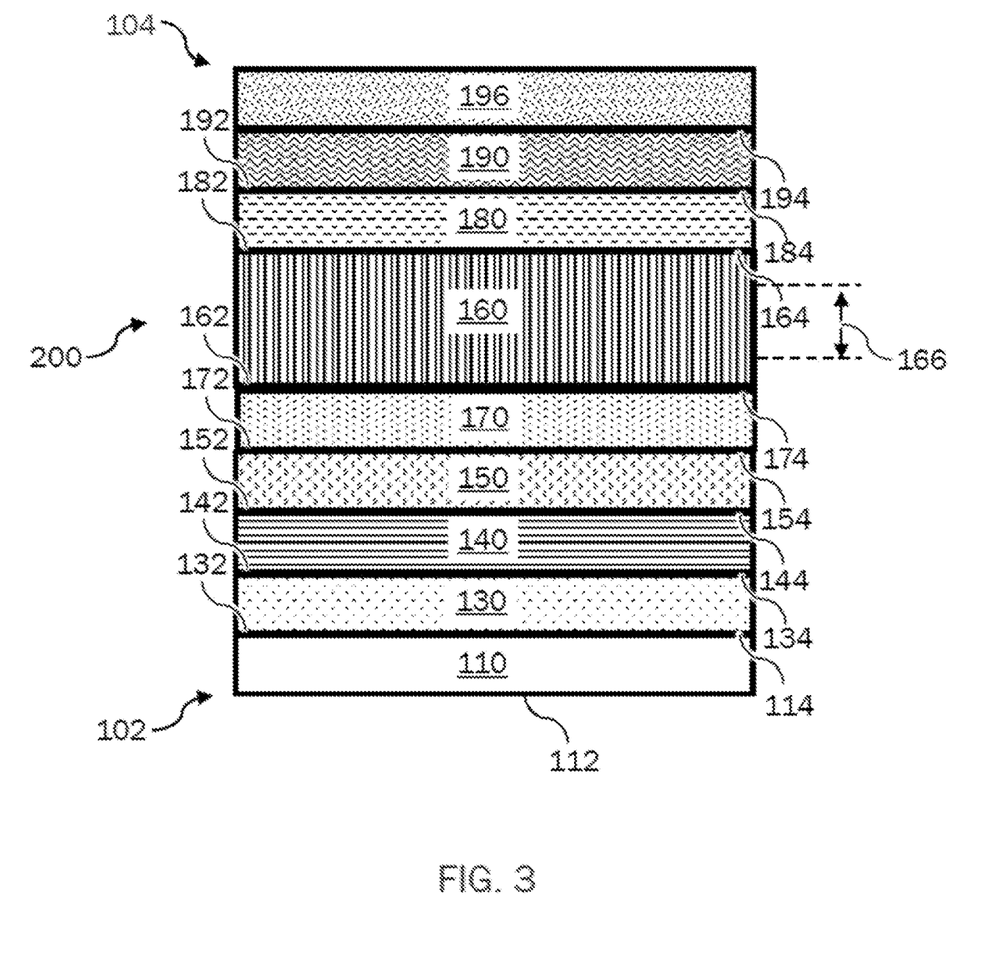
FIG. 3 schematically depicts a photovoltaic device according to one or more embodiments shown and described herein.

Referring now to FIG. 3, in some embodiments, a photovoltaic device 200 can include a window layer 170 comprising n-type semiconductor material. Aside from the window layer 170, the photovoltaic device 200 can have a substantially similar layer structure as the photovoltaic device 100 (FIG. 1). The absorber layer 160 can be formed adjacent to the window layer 170. The window layer 170 can have a first surface 172 substantially facing the energy side 102 of the photovoltaic device 200 and a second surface 174 substantially facing the opposing side 104 of the photovoltaic device 200. In some embodiments, the window layer 170 can be positioned between the absorber layer 160 and the TCO layer 140. In one embodiment, the window layer 170 can be positioned between the absorber layer 160 and the buffer layer 150. The window layer 170 can include any suitable material, including, for example, cadmium sulfide, zinc sulfide, cadmium zinc sulfide, zinc magnesium oxide, or any combination thereof.

Referring again to FIG. 1, the photovoltaic device 100 can include a back contact layer 180 configured to mitigate undesired alteration of the dopant and to provide electrical contact to the absorber layer 160. The back contact layer 180 can have a first surface 182 substantially facing the energy side 102 of the photovoltaic device 100 and a second surface 184 substantially facing the opposing side 104 of the photovoltaic device 100. A thickness of the back contact layer 180 can be defined between the first surface 182 and the second surface 184. The thickness of the back contact layer 180 can be between about 5 nm to about 200 nm such as, for example, between about 10 nm to about 50 nm in one embodiment.

In some embodiments, the back contact layer 180 can be provided adjacent to the absorber layer 160. For example, the first surface 182 of the back contact layer 180 can be provided upon the second surface 164 of the absorber layer 160. In some embodiments, the back contact layer 180 can include binary or ternary combinations of materials from groups I, II, VI, such as for example, one or more layers containing zinc, copper, cadmium and tellurium in various compositions. Further exemplary materials include, but are not limited to, zinc telluride doped with a dopant (e.g., copper telluride), or zinc telluride alloyed with copper telluride.

The photovoltaic device 100 can include a conducting layer 190 configured to provide electrical contact with the absorber layer 160. The conducting layer 190 can have a first surface 192 substantially facing the energy side 102 of the photovoltaic device 100 and a second surface 194 substantially facing the opposing side 104 of the photovoltaic device 100. In some embodiments, the conducting layer 190 can be provided adjacent to the back contact layer 180. For example, the first surface 192 of the conducting layer 190 can be provided upon the second surface 184 of the back contact layer 180. The conducting layer 190 can include any suitable conducting material such as, for example, one or more layers of nitrogen-containing metal, silver, nickel, copper, aluminum, titanium, palladium, chrome, molybdenum, gold, or the like. Suitable examples of a nitrogen-containing metal layer can include aluminum nitride, nickel nitride, titanium nitride, tungsten nitride, selenium nitride, tantalum nitride, or vanadium nitride.

The photovoltaic device 100 can include a back support 196 configured to cooperate with the substrate 110 to form a housing for the photovoltaic device 100. The back support 196 can be disposed at the opposing side 102 of the photovoltaic device 100. For example, the back support 196 can be formed adjacent to conducting layer 190. The back support 196 can include any suitable material, including, for example, glass (e.g., soda-lime glass).

Referring collectively to FIGS. 1 and 3, manufacturing of a photovoltaic device 100, 200 generally includes sequentially disposing functional layers or layer precursors in a "stack" of layers through one or more processes, including, but not limited to, sputtering, spray, evaporation, molecular beam deposition, pyrolysis, closed space sublimation (CSS), pulse laser deposition (PLD), chemical vapor deposition (CVD), electrochemical deposition (ECD), atomic layer deposition (ALD), or vapor transport deposition (VTD). Once a layer is formed it may be desirable to modify the physical characteristics of the layer through subsequent treatment processes.

Figure 4:
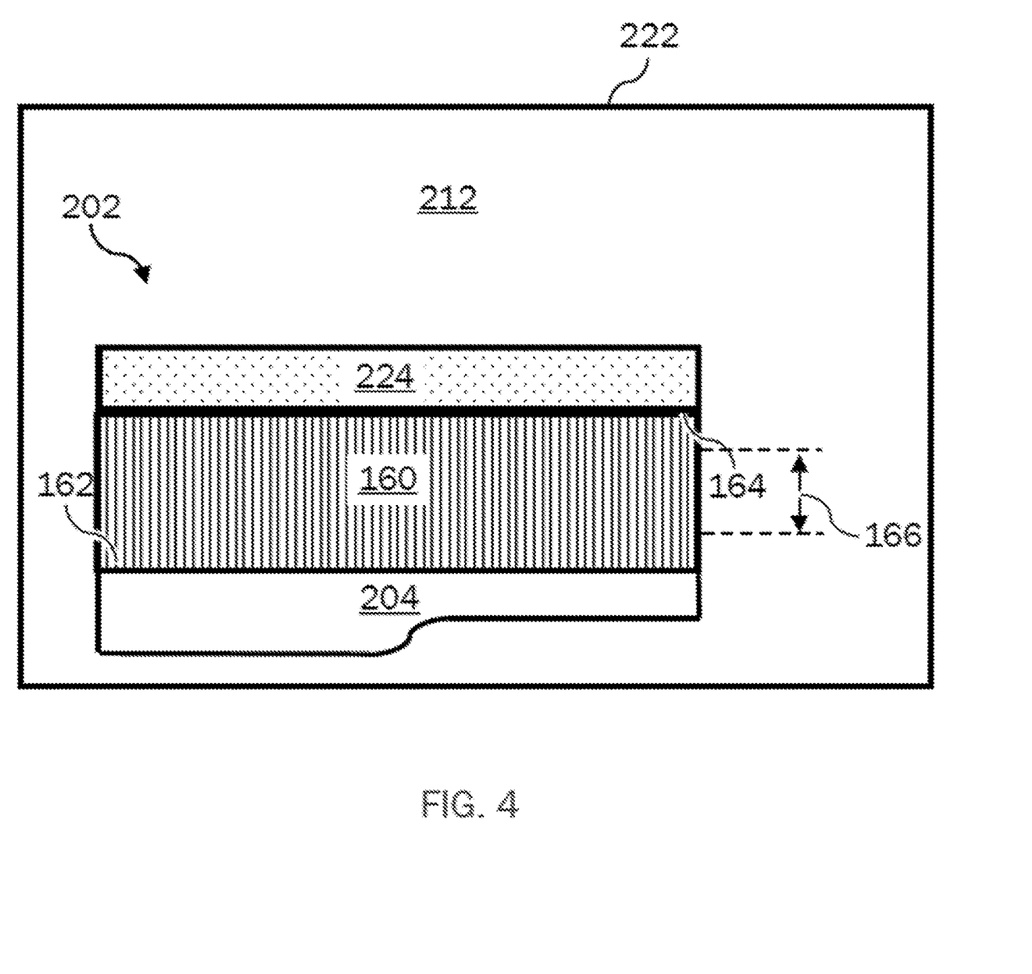
FIGS. 4 and 5 schematically depict partially formed photovoltaic devices according to one or more embodiments shown and described herein.
Figure 5:
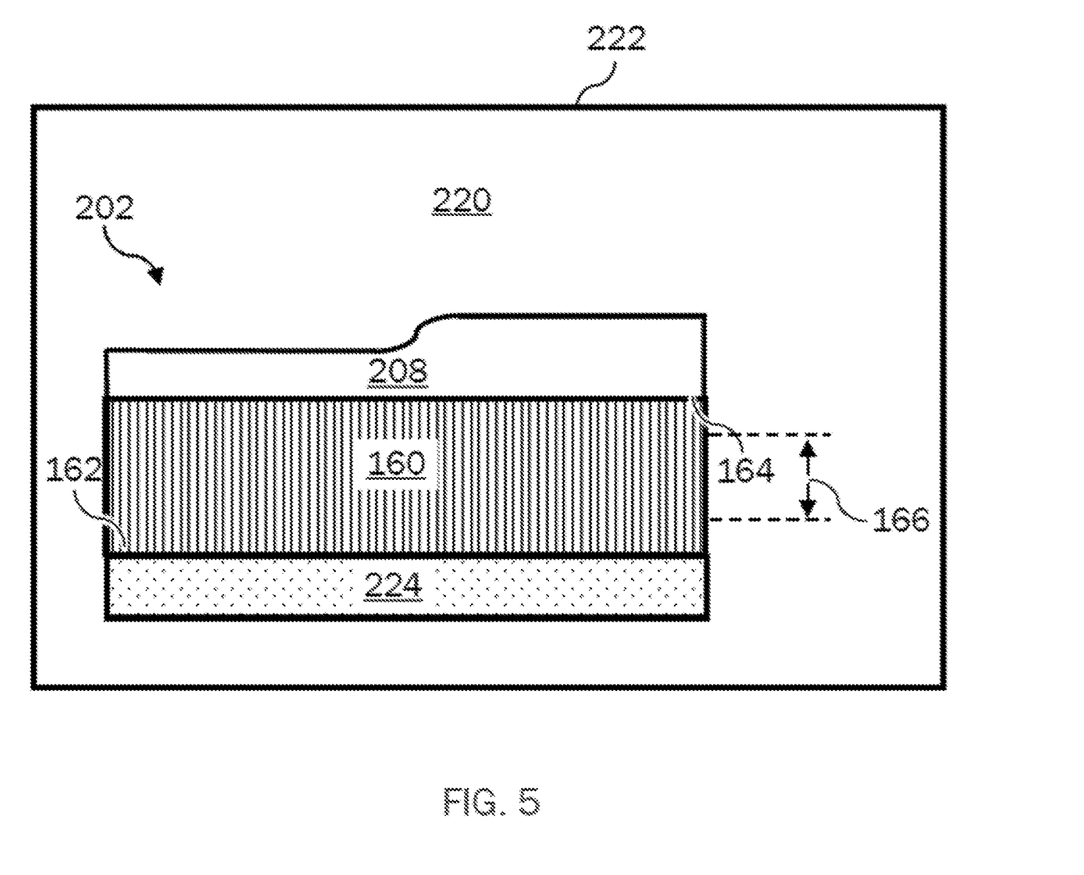

Referring collectively to FIGS. 4 and 5, a layer of a partially formed device can be processed. In some embodiments, a partially formed photovoltaic device 202 can comprise the absorber layer 160 adjacent to a layer stack 204. The layer stack 204 can include one or more of the layers of the photovoltaic device 100, 200 (FIGS. 1 and 3) disposed between the absorber layer 160 and the energy side 102. Alternatively, a partially formed photovoltaic device 206 can comprise the absorber layer 160 adjacent to a layer stack 208. The layer stack 208 can include one or more of the layers of the photovoltaic device 100, 200 (FIGS. 1 and 3) between the absorber layer 160 and the opposing side 104.

Figure 6:
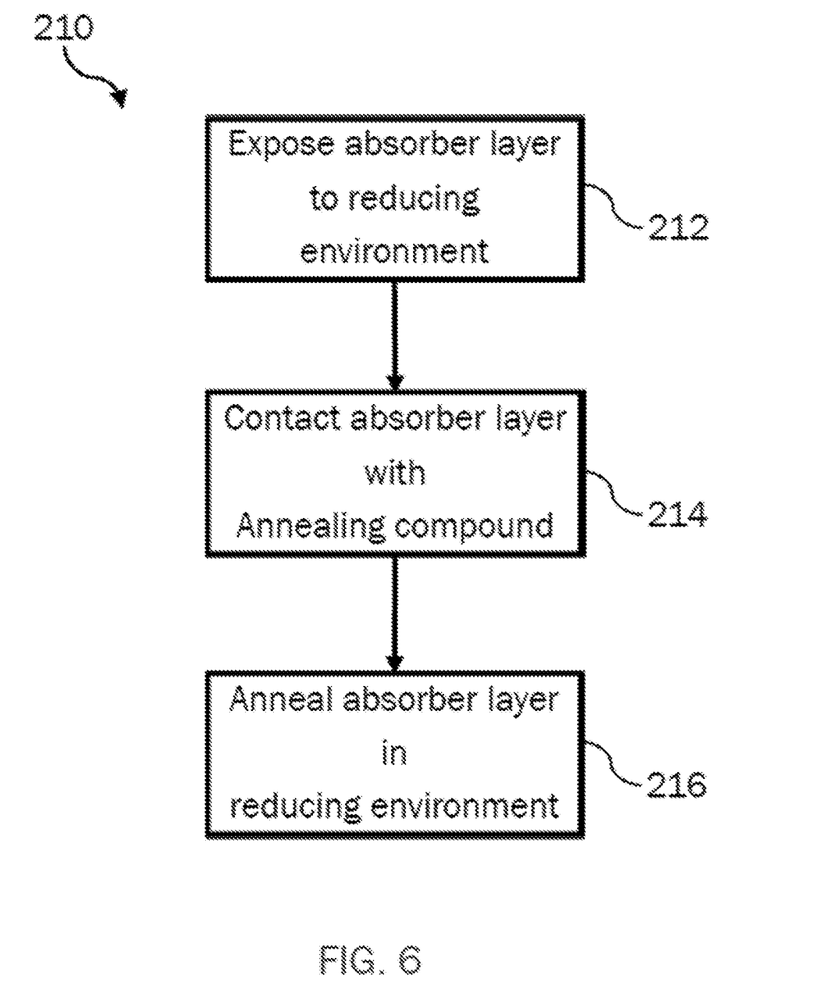
FIG. 6 schematically depicts a method for performing a solution based method for doping an absorber layer with group V dopants according to one or more embodiments shown and described herein.

Referring now to FIG. 6, a method 210 for performing group V doping is depicted. The group V doping includes an annealing process that employs a chemical compound and, optionally, a reducing atmosphere. Referring collectively to FIGS. 4, 5, and 6, the method 210 can include a process 212 for exposing the absorber layer 160 to a reducing environment 220. The first surface 162 or the second surface 164 of the absorber layer 160 can be subjected to the reducing environment 220. The reducing environment 220 is an atmospheric condition in which oxidation is mitigated by removal of oxygen and other oxidizing gases or vapors, i.e., the reducing environment can be substantially free of substances tending to oxidize the Group V dopants. Additionally, the reducing environment 220 can include a forming gas configured to mitigate the formation of group V oxides. The forming gas can be energetically more favorable to oxidation than the group V dopant, i.e., an oxidation reaction of the forming gas during the ARHT can have a more negative Gibbs free energy change ($\Delta G$) than the group V dopant.

In some embodiments, the forming gas can comprise hydrogen, nitrogen, carbon, or combinations thereof. In one embodiment, the forming gas consists essentially of a mixture of $H_2$ and $N_2$. For example, the forming gas can comprise a mixture of about 50.0 to 99.4% $N_2$ and about 0.6 to 3.0% $H_2$. Alternatively, the forming gas can comprise $H_2$ in an atomic fraction range of 0.5-100%. Thus, the reducing environment 220 can comprise a forming gas consisting essentially of 100% $H_2$. Other suitable reducing agents can include methane ($CH_4$), carbon monoxide (CO), hydrogen sulfide ($H_2S$), and ammonia compounds ($NH_3$). In some embodiments, the reducing environment 220 can be provided within a processing chamber 222 configured to substantially prevent the inclusion of substances tending to oxidize Group V dopants within the reducing environment 220. Accordingly, in some embodiments, the reducing environment 220 can consist essentially of the forming gas. Alternatively or additionally, the processing chamber 222 can be configured to maintain partial vacuum pressure. Accordingly, the reducing environment 220 can be provided at a vacuum pressure in a range of about 200 Torr to about 800 Torr such as, for example, in a range of about 3 Torr to about 50 Torr.

The method 210 for group V doping can include a process 214 for contacting the absorber layer 160 with an annealing compound 224. In some embodiments, the annealing compound 224 can be applied to the first surface 162 or the second surface 164 of the absorber layer 160 as a solution. For example, the annealing compound 224 can be sprayed, spin coated, or roll coated upon the absorber layer 160. The annealing compound 224 comprises a combination of cadmium chloride ($CdCl_2$) and a group V salt. As used herein, the term "salt" can mean an ionic compound having two parts—a cation and an anion. Both the cation, the anion, or both can be formed from an element or a compound. Group V salts are salts where the cation, the anion, or both comprise a group V element such as, for example, nitrogen (N), phosphorous (P), arsenic (As), antimony (Sb), bismuth (Bi), ununpentium (Uup), or a combination thereof. Suitable examples of a group V salt include, but are not limited to, ammonium dihydrogen arsenate ($NH_4H_2AsO_4$), diammonium hydrogen phosphate (($NH_4)_2HPO_4$), ammonium arsenate ($NH_4)_3AsO_4$, cadmium arsenate ($Cd_3(AsO_4)_2$), Sodium (meta)arsenite ($NaAsO_2$), Bismuth trichloride ($BiCl_3$), or combinations thereof. In some embodiments, the group V salt can be soluble by a solvent such as, for example, water, alcohol, or the like.

The composition of the annealing compound 224 is controlled such that a desired proportion of the annealing compound 224 is provided as a group V salt. For example, the desired proportion of group V salt to the total amount of the annealing compound 224 can be less than about 100 grams per liter (g/L) such as, for example, less than about 25 g/L in one embodiment, between about ⅕ g/L and about 20 g/L in another embodiment, between about ⅒ g/L and about 10 g/L in yet another embodiment, or between about ½ g/L and about 2 g/L in a further embodiment. Generally, the annealing compound 224 comprises more cadmium chloride than group V salt on a weight per volume basis, e.g., measured by grams per liter. Specifically, a ratio of cadmium chloride to group V salt within the annealing compound 224, on a weight per volume basis, can be at least 30 to 1 such as, for example, between about 35 to 1 and about 8,000 to 1 in one embodiment, between about 150 to 1 and about 6,500 to 1 in another embodiment, and between about 300 to 1 and about 2,000 to 1 in a further embodiment.

In some embodiments, the annealing compound 224 can be provided as separate components. For example, the group V salt, the cadmium chloride, or both can be evaporated on to the absorber layer 160 and condensed as a film. For example, the group V salt and the cadmium chloride can be evaporated sequentially over one another. Alternatively, the group V salt and the cadmium chloride can be co-evaporated on to the absorber layer 160. In further embodiments, one or more of the components of the annealing compound 224 can be provided in the vapor phase. For example, the group V salt, the cadmium chloride, or both can contact the absorber layer 160 in vapor phase.

The method 210 for group V doping can include a process 216 for annealing the absorber layer 160 in the reducing environment 220. Generally, annealing includes heating the absorber layer 160 (e.g., polycrystalline semiconductor material) for sufficient time and temperature to facilitate re-crystallization of the absorber layer 160. For example, the absorber layer 160 can be processed at a temperature between about 350° C. and about 500° C. for between about 5 minutes and about 60 minutes such as, for example, at a temperature in a range of about 400° C. to about 500° C. for a duration of about 10 minutes to about 55 minutes, in one embodiment, or at a temperature in a range of about 400° C. to about 450° C. for a duration of about 15 minutes to about 50 minutes, in another embodiment. In alternative embodiments, annealing can be performed in the presence of a forming gas, annealing can be performed multiple times, or both. For example, in some embodiments, the absorber layer 160 can be exposed to cadmium chloride and annealed in a non-reducing atmosphere with a subsequent annealing performed in the presence of the group V salt.

It is noted that, while process 212, process 214, and process 216 may be depicted in a sequential manner in FIG. 6, the embodiments provided herein are not limited to any particular order of process 212, process 214, and process 216. In some embodiments, a surface of the absorber layer 160 can be initially contacted with the annealing compound 224 while in the reducing environment 220, and during annealing. In other embodiments, a surface of the absorber layer 160 can be contacted with the annealing compound 224 and subsequently placed in the reducing environment 220 and annealed. In some embodiments, each of process 212, process 214, and process 216 can be performed contemporaneously, i.e., the annealing compound 224 can remain in contact with the absorber layer 160 for at least a portion of the annealing in the reducing environment 220. For example, the group V salt can be provided in vapor phase around an absorber layer 160 coated with cadmium chloride.

In addition to recrystallization of the absorber layer 160, the presence of cadmium chloride can result in grain growth in the absorber layer 160, i.e., an increase in the gran size of the absorber layer 160. Moreover, the group V dopants present in the annealing compound 224 as group V salt can diffuse into absorber layer 160 and dope the absorber layer 160. Accordingly, grain growth of the absorber layer 160 and doping of the absorber layer 160 can occur contemporaneously.

In some embodiments, grain growth of the absorber layer 160, doping of the absorber layer 160, and activation of the group V dopants can occur contemporaneously. For example, in some embodiments, the annealing compound 224 can include one or more alkali metal chloride. The alkali metal chlorides can be formed from an alkali metal such as, for example, lithium (Li), sodium (Na), potassium (K), rubidium (Rb), cesium (Cs), and francium (Fr). Suitable alkali metal chlorides include, but are not limited to, LiCl, NaCl, KCl, RbCl, or combinations thereof. The composition of the annealing compound 224 is controlled such that a desired ratio of cadmium to alkali metal is maintained. Generally, the annealing compound 224 includes much more cadmium than alkali metal as measured by atomic ratio. For example, the desired ratio of alkali metal to cadmium can be less than about 10,000 parts per million (ppm).

It should now be understood that the embodiments provided herein, relate to methods for doping an absorber layer with group V dopants with an annealing compound comprising a group V salt. Testing has demonstrated that the use of group V salts can improve the transfer efficiency of group V dopants into the absorber layer compared to known methods. For example, when transfer efficiency is measured by weight per unit of area of incorporated dopant to weight per unit of area of applied dopant, the transfer efficiency was improved compared to doping during vapor transport deposition of the absorber layer. Specifically, arsenic doping demonstrated an improvement of about 300% to 600%.

According to the embodiments of the present disclosure, a method for doping an absorber layer can include exposing an absorber layer to a reducing environment. The absorber layer can include cadmium and tellurium. The method can include contacting the absorber layer with an annealing compound. The annealing compound can include cadmium chloride and a group V salt comprising an anion and a cation. The anion, the cation, or both can include a group V element. A ratio of cadmium chloride to group V salt within the annealing compound, on a weight per volume basis, can be at least 30 to 1. The method can include annealing the absorber layer, whereby the absorber layer is doped with at least a portion of the group V element of the annealing compound.

It is noted that the terms "substantially" and "about" may be utilized herein to represent the inherent degree of uncertainty that may be attributed to any quantitative comparison, value, measurement, or other representation. These terms are also utilized herein to represent the degree by which a quantitative representation may vary from a stated reference without resulting in a change in the basic function of the subject matter at issue.

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

What is claimed is:

1. A method for doping an absorber layer, comprising:
   contacting the absorber layer with an annealing compound, wherein:
   the absorber layer comprises cadmium, and tellurium;
   the annealing compound comprises cadmium chloride and a group V salt comprising an anion and a cation;
   the anion, the cation, or both comprise a group V element;
   a ratio of cadmium chloride to group V salt within the annealing compound, on a weight per volume basis, is at least 30 to 1; and
   annealing the absorber layer, whereby the absorber layer is doped with at least a portion of the group V element of the annealing compound.

2. The method of claim 1, wherein the annealing compound is a solution, and a proportion of the group V salt to a total amount of the annealing compound is less than 100 grams per liter.

3. The method of claim 2, wherein the proportion of the group V salt to the total amount of the annealing compound is between 1/25 grams per liter and 20 grams per liter.

4. The method of claim 1, wherein a grain size of the absorber layer is increased during annealing of the absorber layer.

5. The method of claim 1, wherein the group V salt is ammonium dihydrogen arsenate.

6. The method of claim 1, wherein the group V salt is diammonium hydrogen phosphate.

7. The method of claim 1, wherein the group V element is nitrogen.

8. The method of claim 1, wherein the group V element is phosphorous.

9. The method of claim 1, wherein the group V element is arsenic.

10. The method of claim 1, wherein the group V element is antimony.

11. The method of claim 1, wherein the group V element is bismuth.

12. The method of claim 1, comprising exposing an absorber layer to a reducing environment, while the absorber layer is annealed.

13. The method of claim 12, wherein the reducing environment comprises a forming gas configured to mitigate formation of group V oxides, the forming gas comprising hydrogen, nitrogen, carbon, or combinations thereof.

14. The method of claim 1, wherein the absorber layer is annealed at a temperature between 350° C. and 500° C. for between 5 minutes and 60 minutes.

15. The method of claim 1, wherein:
   the annealing compound comprises an alkali metal chloride; and
   at least a portion of the group V dopant is activated during annealing of the absorber layer.

16. The method of claim 1, wherein, after the absorber layer is annealed, an atomic concentration of the group V dopant in a central region of the absorber layer is greater than $1 \times 10^{16}$ cm$^{-3}$.

17. The method of claim 1, wherein the absorber layer comprises selenium.

18. The method of claim 1, wherein a grain size of the absorber layer is increased during annealing of the absorber layer.

19. The method of claim 1, wherein the group V salt is ammonium dihydrogen arsenate.

20. The method of claim 1, wherein the group V salt is diammonium hydrogen phosphate.

21. The method of claim 1, wherein the group V element is nitrogen.

22. The method of claim 1, wherein the group V element is phosphorous.

23. The method of claim 1, wherein the group V element is arsenic.

24. The method of claim 1, wherein the group V element is antimony.

25. The method of claim 1, wherein the group V element is bismuth.

26. The method of claim 1, comprising exposing an absorber layer to a reducing environment, while the absorber layer is annealed.

27. The method of claim 26, wherein the reducing environment comprises a forming gas configured to mitigate formation of group V oxides, the forming gas comprising hydrogen, nitrogen, carbon, or combinations thereof.

\* \* \* \* \*